(12) United States Patent
Peters

(10) Patent No.: US 9,463,719 B2
(45) Date of Patent: Oct. 11, 2016

(54) FITTING FOR A VEHICLE SEAT, AND VEHICLE SEAT

(71) Applicant: Johnson Controls Components GmbH & Co. KG, Kaiserslautern (DE)

(72) Inventor: Christoph Peters, Wermelskirchen (DE)

(73) Assignee: Johnson Controls Components GmbH & Co. KG, Kaiserslautern (DE)

( * ) Notice: Subject to any disclaimer, the term of this patent is extended or adjusted under 35 U.S.C. 154(b) by 3 days.

(21) Appl. No.: 14/362,719

(22) PCT Filed: Jan. 5, 2013

(86) PCT No.: PCT/EP2013/000016
§ 371 (c)(1),
(2) Date: Jun. 4, 2014

(87) PCT Pub. No.: WO2013/104532
PCT Pub. Date: Jul. 18, 2013

(65) Prior Publication Data
US 2014/0333114 A1    Nov. 13, 2014

(30) Foreign Application Priority Data

Jan. 12, 2012    (DE) .................. 10 2012 000 776
Mar. 21, 2012    (DE) .................. 10 2012 005 963

(51) Int. Cl.
*B60N 2/44*    (2006.01)
*B60N 2/23*    (2006.01)
*B60N 2/235*    (2006.01)
*C23C 14/06*    (2006.01)
(Continued)

(52) U.S. Cl.
CPC ................. *B60N 2/236* (2015.04); *B60N 2/02* (2013.01); *B60N 2/44* (2013.01); *B60N 2/4435* (2013.01); *C23C 14/06* (2013.01); *C23C 14/0605* (2013.01); *C23C 14/0635* (2013.01); *C23C 14/34* (2013.01); *C23C 14/3464* (2013.01); *B60N 2205/30* (2013.01)

(58) Field of Classification Search
CPC ........................... B60N 2/2356; B60N 2/4435
USPC ........................................... 297/367 P, 367 R
See application file for complete search history.

(56) References Cited

U.S. PATENT DOCUMENTS 5,634,689 A * 6/1997 Putsch et al. ................. 297/362
7,828,386 B2 * 11/2010 Reubeuze et al. ........ 297/367 P
(Continued)

FOREIGN PATENT DOCUMENTS

DE    199 28 148 A1    1/2001
DE    202 20 200 U1    2/2004
(Continued)

*Primary Examiner* — Timothy J Brindley
(74) *Attorney, Agent, or Firm* — McGlew and Tuttle, P.C.

(57) ABSTRACT

A fitting (5) for a vehicle seat, in particular for a motor vehicle seat, includes a first fitting part (7), a second fitting part (8) that can be rotated relative to the first fitting part (7) about an axis (A), a drivable eccentric (11), rotatably supported about the axis (A), and at least one catch (13), which is guided by the first fitting part (7) such as to be movable in a radial direction relative to the axis (A) and which moves radially outward under the action of the eccentric (11) to lock the fitting (5) and interacts radially outwardly with the second fitting part (8). The at least one catch (13) includes a first bar part (13a) and a second bar part (13b), each of which has teeth (13a', 13b') for interacting with teeth of the second fitting part (8) designed as a toothed ring (8a).

15 Claims, 5 Drawing Sheets

(51) Int. Cl.
*C23C 14/34* (2006.01)
*B60N 2/02* (2006.01)

(56) References Cited

U.S. PATENT DOCUMENTS

| | | | |
|---|---|---|---|
| 8,460,145 B2* | 6/2013 | Mitsuhashi | 475/162 |
| 2010/0052393 A1* | 3/2010 | Mitsuhashi et al. | 297/367 R |
| 2011/0012414 A1* | 1/2011 | Yamada et al. | 297/367 P |
| 2011/0169314 A1* | 7/2011 | Tanguy et al. | 297/367 P |
| 2013/0154331 A1* | 6/2013 | Ito | 297/367 P |
| 2013/0270883 A1* | 10/2013 | Becker et al. | 297/367 P |
| 2015/0165936 A1* | 6/2015 | Wei et al. | 297/367 P |

FOREIGN PATENT DOCUMENTS

| | | |
|---|---|---|
| DE | 102 53 054 A1 | 6/2004 |
| DE | 10 2007 059 510 C5 | 5/2011 |
| EP | 1 928 691 B1 | 9/2011 |
| JP | 2002-101999 A | 4/2002 |
| WO | 2004/043733 A1 | 5/2004 |

* cited by examiner

FITTING FOR A VEHICLE SEAT, AND VEHICLE SEAT

CROSS REFERENCE TO RELATED APPLICATIONS

This application is a United States National Phase Application of International Application PCT/EP2013/000016 filed Jan. 5, 2013 and claims the benefit of priority under 35 U.S.C. §119 of German Patent Applications DE 10 2012 000 776.0 filed Jan. 12, 2012 and DE 10 2012 005 963.9 filed Mar. 21, 2012, the entire contents of which are incorporated herein by reference.

FIELD OF THE INVENTION

The invention relates to a fitting for a vehicle seat, in particular for a motor vehicle seat, having a first fitting part, a second fitting part, which is rotatable relative to the first fitting part about an axis, a driveable eccentric, which is mounted so as to be rotatable about the axis, and at least one catch, which is guided by the first fitting part so as to be movable in a radial direction with respect to the axis and which, for the locking of the fitting, can be moved radially outward under the action of the eccentric and interacts radially at the outside with the second fitting part.

BACKGROUND OF THE INVENTION

For the complete reduction of play in the case of known, generic fittings, it is necessary to compensate not only the guide play of the catch but also bearing play of the fitting at the bearing point, in particular between a toothed ring of the second fitting part and guide elements of the first fitting part.

EP 1 928 691 B1 discloses a means for play reduction for a latching fitting with four catches. For an increase in strength and reduction in play, four oppositely tilting catches are provided. This principle for play reduction has an adequate effect in the case of a latching fitting with three or four catches, in which the catches, owing to their arrangement along the circumference of the fitting, can compensate bearing play of the fitting by virtue of the catches generating statically determinate or overdeterminate forces in different directions on the toothed ring. In the case of a latching fitting with only one or two catches, this is not fully possible owing to static indeterminacy, which impairs the effectiveness of said already known form of play reduction.

DE 10 2007 059 510 C5 discloses a locking element of a locking device, said locking element being composed of individual interconnected lamellae. In this way, it is possible, in the manner of a modular system, to realize an adaptation of the component thickness to product-specific load demands. The lamellar type of construction however has no influence on a reduction in play of the locking device.

DE 202 20 200 U1 discloses a bidirectionally acting drive for rotating a drive wheel, which is connected to an adjustment device, and a pawl, which interacts, for transmission of torque, with the drive wheel. For this purpose, the pawl has diametrically mutually opposite toothing regions which interact with an internal toothing of the drive wheel. The pawl either engages by way of one of the two toothing regions into the internal toothing of the drive wheel, or both toothing regions are out of engagement. A reduction in play by means of an engagement of both toothing regions into the internal toothing is not possible.

SUMMARY OF THE INVENTION

A problem addressed by the invention is that of improving a fitting of the type mentioned in the introduction, and in particular of providing a facility for effective play reduction in the case of fittings with one or two catches, and of providing a corresponding vehicle seat.

According to the invention a fitting for a vehicle seat, in particular for a motor vehicle seat is provided comprising a first fitting part, a second fitting part, which is rotatable relative to the first fitting part about an axis, a driveable eccentric, which is mounted so as to be rotatable about the axis, and at least one catch, which is guided by the first fitting part so as to be movable in a radial direction with respect to the axis. The catch can be moved radially outward under the action of the eccentric for the locking of the fitting. The at least one catch interacts radially at the outside with the second fitting part. The at least one catch comprises a first catch part and a second catch part. Each of the catch parts has a toothing for interacting with a toothing, in the form of a toothed ring, of the second fitting part.

Optimized play compensation is provided by virtue of the at least one catch being composed of a first catch part and a second catch part, and each of the catch parts having a toothing for interacting with a toothed ring of the second fitting part.

The first catch part and the second catch part are tilted and braced counter to one another in the guide by an eccentric which acts on a catch cam on each of the two catch parts. For this purpose, in a preferred embodiment, the eccentric, by way of eccentric cams, exerts a force on each of the two catch parts in different directions, such that the two catch parts are subjected to torques in mutually opposite directions of rotation about in each case a contact point between the first catch part and the toothed ring and a contact point between the second catch part and the toothed ring.

The toothing of the catch parts is ideally modified such that each individual toothing of a catch part has a defined bearing point with respect to the toothing of the toothed ring of the second fitting part. In this way, improved tooth overlap is obtained in relation to a unipartite catch, whereby strength is increased. Furthermore, a reduction in play is obtained as a result of the tilting of the catch parts in the guide path. The control travels required for this purpose are reduced owing to tilting of the catch parts in opposite directions. It is thus possible to compensate all of the arising guide tolerances. Embodiments are particularly suitable in which the base circle radius of the toothings of the catch parts is smaller than the base circle radius of the toothed ring of the second fitting part.

The at least one catch is split into the two catch parts along a parting line. The parting line preferably deviates from the radial direction in regions, such that the two catch parts are connected to one another substantially with a form fit in the radial direction. A relative movement of the two catch parts in the circumferential direction to an extent greater than the guide play is prevented by guide segments of the first fitting part.

For the unlocking of the fitting, it is preferable for a control disk to be provided which is connected rotationally conjointly to the eccentric and which interacts with a lug of the at least one catch in order, during the unlocking process, to move the toothed ring and the at least one catch out of engagement. Owing to the above-described form fit between the two catch parts, it is adequate for only one of the two catch parts of the catch to have a lug. The other catch part is then driven along owing to the form fit.

To avoid tilting moments, it is advantageous if the lug that interacts with the control disk is situated in the middle of the catch as viewed in the circumferential direction. In this case, the parting line of the catch is preferably guided past the lug.

The increase in strength can be utilized to particularly good effect if the first fitting part and the second fitting part are held together axially by a clasp ring. Owing to the play compensation concept according to the invention, said clasp ring is subject to only low tolerance requirements.

The described play reduction can be applied to fittings with any desired number of split catches greater than or equal to one. The play reduction has a particularly advantageous effect in fittings with precisely two catches, each of which is composed of a first catch part and a second catch part.

For cost optimization, it may be expedient for not all of the catches to be of split form. For example, in the case of a fitting having a number of n catches, one of the n catches could be of non-split form, and n-1 catches could be of split form.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
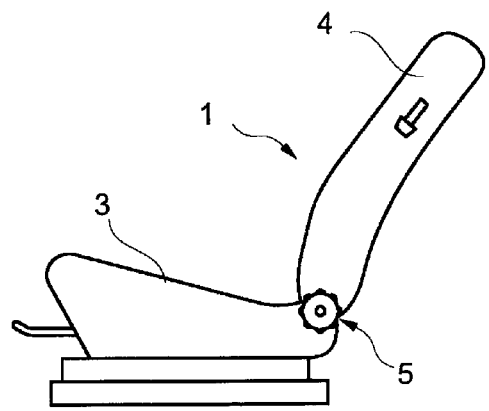
FIG. 1 is a schematic illustration of a vehicle seat according to an exemplary embodiment.

Referring to the drawings in particular, a vehicle seat 1, illustrated in FIG. 1, of a motor vehicle has a seat part 3 and a backrest 4, which backrest is attached laterally to the seat part 3 by means of two fittings 5, is pivotable relative to said seat part 3 about an axis A running horizontally and perpendicular to the direction of travel, and is lockable in different positions of inclination. The axis A which runs between the two fittings 5 defines the directions, specified below, of a cylindrical coordinate system.

Figure 2:
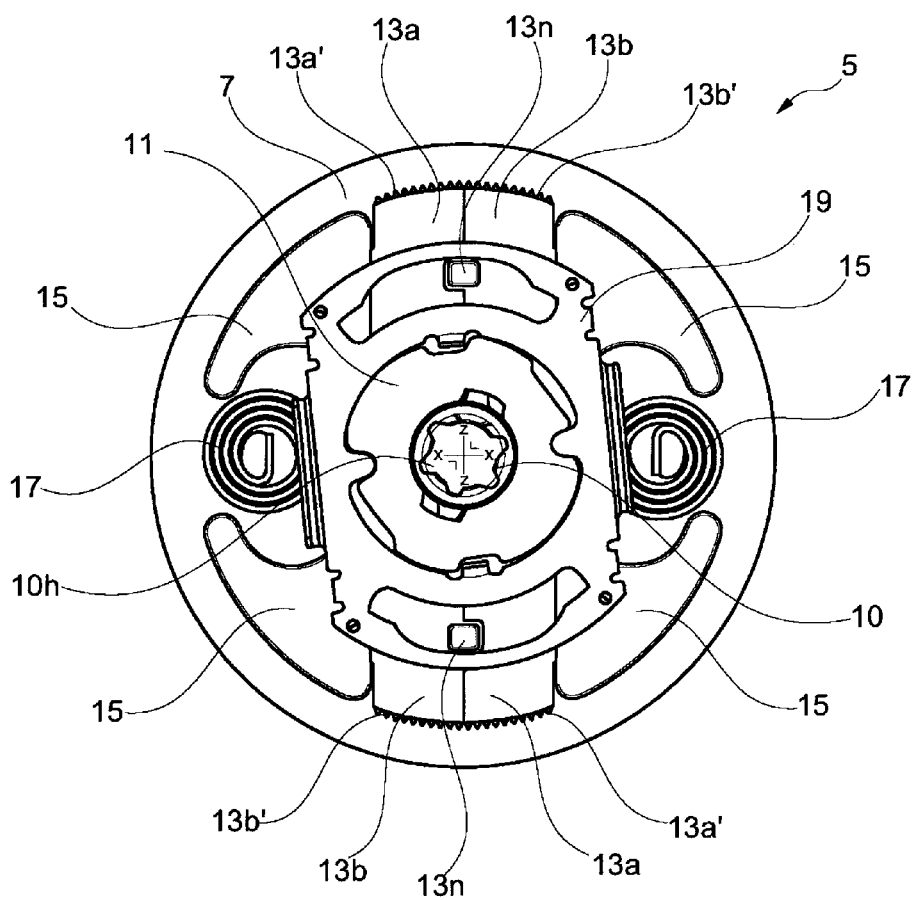
FIG. 2 is a sectional view through the vehicle seat in a plane between control disk and slotted guide.
Figure 3:
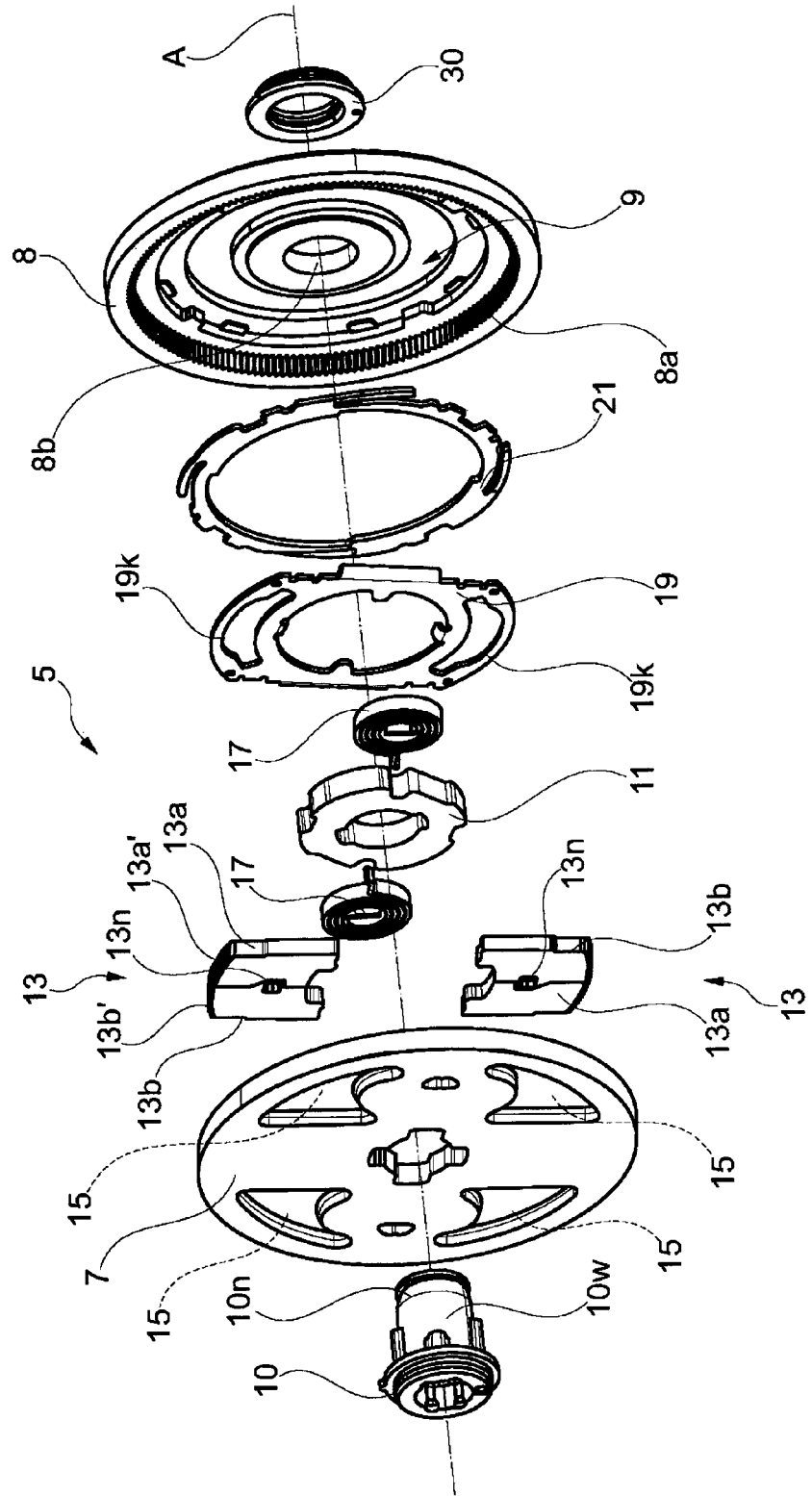
FIG. 3 is an exploded illustration corresponding to FIG. 2.

The fitting 5 illustrated in FIGS. 2 and 3 is based on the same basic principle as a latching fitting known for example from DE 102 53 054 A1. The fitting 5 has a first fitting part 7 and a second fitting part 8 which is rotatable relative to said first fitting part 7 about the axis A, which first fitting part and second fitting part define between them a structural space 9 which receives essential components of the fitting 5. The two fitting parts 7 and 8 can be described in each case approximately as having a circular disk shape. In structural terms, the two fitting parts 7 and 8 form a disk-shaped unit together with a clasp ring (not illustrated in the Figures) such as is known for example from EP 1 928 691 B1. The clasp ring engages over the second fitting part 8 and is connected to the first fitting part 7, whereby the two fitting parts 7 and 8 are held together axially.

After the installation of the fitting 5 into the vehicle seat 1, the first fitting part 7 is fixedly connected to the backrest 4. The second fitting part 8 is fixedly connected to the structure of the seat part 3. The assignments of the fitting parts 7 and 8 may however be interchanged, that is to say the first fitting part 7 would then be fixed to the seat part, and the second fitting part 8 would be fixed to the backrest.

In the center of the fitting 5 there is arranged a driver 10 which is mounted, rotatably about the axis A, on the second fitting part 8. An eccentric 11 is seated rotationally conjointly on, or at least coupled in terms of drive to, the driver 10. The eccentric 11 acts, by way of eccentric cams distributed over the circumference thereof, on catch cams of two catches 13. The catches 13 are arranged, offset with respect to one another by 180° about the eccentric 11, in the structural space 9, and are provided, on their radially outer side in relation to the axis A (that is to say on the side facing away from the catch cams), with a toothing for interacting with a toothing, in the form of a toothed ring 8a, of the second fitting part 8. The catches 13 are guided in the radial direction by guide segments 15 of the first fitting part 7. The second fitting part 8 lies by way of the toothed ring 8a on the four guide segments 15, whereby the second fitting part 8 is mounted on the first fitting part 7.

A spring arrangement 17 acts on the eccentric 11 such that the latter pushes the catches 13 radially outward, that is to say into the toothing of the toothed ring 8a of the second fitting part 8, whereby the fitting 5 is locked. A control disk 19 is arranged in the structural space 9 axially between the catches 13 and the second fitting part 8, and in the present case is seated rotationally conjointly on the eccentric 11. The control disk 19 has two slotted guides 19k, each of which interacts with a lug 13n of a respective catch 13, wherein the lugs 13n project from the catches 13 in the axial direction.

An operating lever (not illustrated in the Figures) is fastened to the driver 10, for example by means of a profiled peg which is inserted into, and thereby connected rotationally conjointly to, the driver 10 which, in the region of the axis A, is designed as a profiled hollow shaft 10h.

In the event of an actuation of the operating lever and the resulting rotation of the driver 10—and of the eccentric 11 which is driven by said driver and of the control disk 19—counter to the force of the spring arrangement 17, the control disk 19 pulls the catches 13 radially inward, that is to say out of the toothing of the toothed ring 8a, whereby the fitting 5 is unlocked.

The driver 10 is mounted in an opening 8b of the second fitting part 8. Two integrally formed ribs of the driver 10 bear in the axial direction against the inner side of the second fitting part 8, while a securing ring 30 arranged on the outer side of the second fitting part 8 is seated fixedly on a shaft section 10w, which projects out of the opening 8b of the second fitting part 8, of the driver 10, said securing ring in particular being clipped onto said shaft section 10w. For this purpose, the shaft section 10w has a groove 10n into which a clipping geometry of the securing ring 30 is clipped. The driver 10 is thus secured axially.

Furthermore, the fitting 5 has a free-pivoting slotted guide 21, such as is known per se, which allows the catch 13 to engage into the toothed ring 8a only in defined angular positions of the first fitting part 7 with respect to the second fitting part 8. A free-pivoting slotted guide of said type is known for example from DE 199 28 148 A1.

Figure 4:
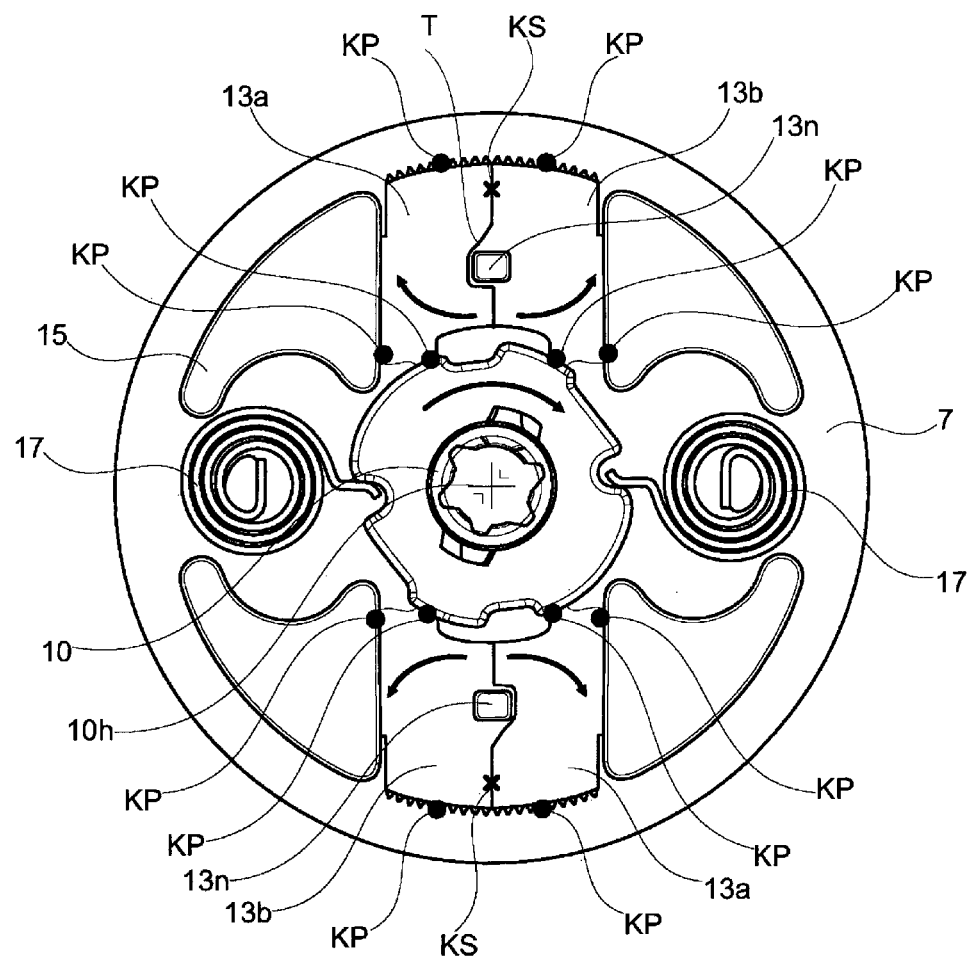
FIG. 4 is a sectional view corresponding to FIG. 2, but without the control disk and with multiple arrows indicating the directions of motion of the catch parts during a locking process, and all possible contact points.

FIG. 4 shows the way in which the play reduction is effected by means of the split catch 13. Each of the two catches 13 is composed of a first catch part 13a and a second catch part 13b. In the present case, a parting line T between the first catch part 13a and second catch part 13b runs substantially in a radial direction and also runs through the toothing of the catch 13, such that said toothing is likewise split. The second catch part 13b in each case bears the lug 13n for interacting with the control disk 19.

The parting line T that splits the catch 13 into the two catch parts 13a and 13b has line sections which deviate from the radial direction. The parting line T preferably has sections in the circumferential direction. In the present case, as viewed radially from the inside outward, the parting line runs initially in the radial direction, then bends through 90° in the circumferential direction toward the first catch part 13a, and subsequently runs onward in the radial direction, interrupted by a subsection that runs at an angle of 45° with respect to the radial direction.

Owing to the guidance of the catch parts 13a and 13b between the guide paths of two guide segments 15, which prevent a relative movement of the two catch parts 13a and 13b in the circumferential direction to an extent greater than the guide play, the two catch parts 13a, 13b are also connected to one another substantially with a form fit in the radial direction. Only a slight relative movement, which is required according to the invention for play compensation, is possible.

For clarity, the second fitting part 8 is not shown in FIG. 4, which illustrates the locked state. The catches 13 are engaged into the toothing 8a of the second fitting part 8. The arrows indicate the direction of motion of the catch parts 13a, 13b and of the eccentric 11 during the locking process.

Each catch part 13a, 13b is supported via in each case one primary contact point KP on a cam of the eccentric 11, and via in each case one further primary contact point KP on a guide surface of the guide segment 15 that guides the respective catch part 13a, 13b.

Primary contact points KP refer to the contact points of the catch 13 or the catch parts 13a, 13b thereof with respect to the guide paths of the guide segments 15, with respect to the eccentric 11 and with respect to the toothed ring 8a of the second fitting part 8, which contact points are always present when the fitting 5 is locked. Contact points that absorb forces only under high load, in particular in the event of a crash, are referred to hereinafter as secondary contact points KS. The primary contact points KP are indicated in FIG. 4 by dots. Furthermore, in FIG. 4, in each case one secondary contact point KS between the first catch part 13a and second catch part 13b is indicated by a cross. Under normal operating conditions, the secondary contact point KS does not transmit any forces between the first catch part 13a and second catch part 13b, such a transmission taking place only under high load, as will be described in more detail below.

For an improvement in load capacity and strength, each catch part 13a, 13b has a respective toothing 13a', 13b' with in each case one further primary contact point KP, acting as a bearing point, with respect to the toothing of the toothed ring 8a of the second fitting part 8. This is realized by virtue of a base circle radius of the toothings 13a', 13b' of the catch parts 13a, 13b being reduced in relation to that of the toothing of the toothed ring 8a of the second fitting part 8. In this case, the base circle radius is reduced to such an extent as to permit tilting of the catch parts 13a, 13b, such as is required for the reduction in play, by rolling of the toothings 13a', 13b' in the toothed ring 8a of the second fitting part 8.

The catches 13 are split such that the two catch parts 13a and 13b can engage into the toothing of the toothed ring 8a of the second fitting part 8 and are both held there with self-locking action by the eccentric 11. The wedge angles at the primary contact points KP between the catch cams and the eccentric cams are preferably less than 5.7°, and at most preferably 4.3°.

During the unlocking process, the control disk 19 is driven along by the rotating eccentric 11 and, by means of the slotted guides 19k, pulls the second catch parts 13b radially inward out of the toothed ring 8a by way of the lugs 13n which serve for this purpose, after the eccentric 11 has released the two catch parts 13a, 13b of the two catches 13. The second catch parts 13b, owing to their shaping, pull the first catch parts 13a out of toothed engagement in the same radial direction.

Figure 5:
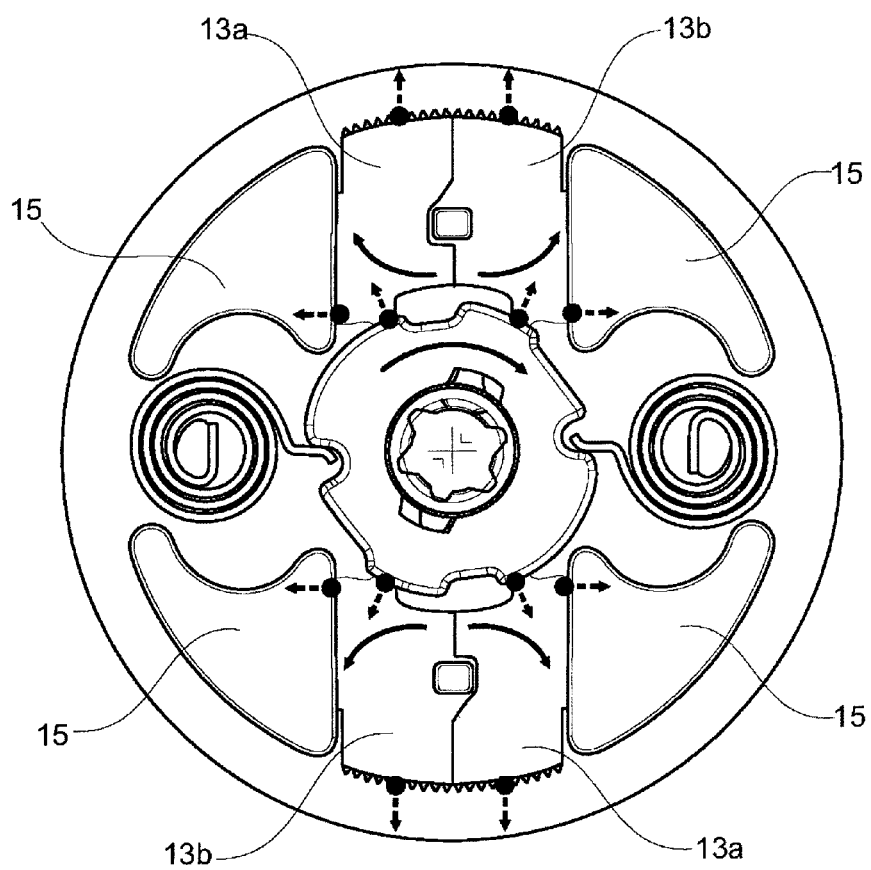
FIG. 5 is a sectional view corresponding to FIG. 4, with an illustration of the acting forces and contact points during the locking process.

In FIG. 5, dashed arrows are used to illustrate the important acting forces for the reduction in play. The catch parts 13a, 13b are preloaded into the guide paths formed by the guide segments 15 of the first fitting part 7 by the forces introduced by the eccentric 11 owing to spring preload. The preload has the effect that there is no remaining free play in the guide. For this purpose, the first catch part 13a is, as already described above, in toothed engagement by way of its toothing 13a' with the toothed ring 8a of the second fitting part 8 at a primary contact point KP. Owing to the force exerted on the catch cams of the first catch part 13a by the eccentric cams of the eccentric 11, the catch part 13a is subjected to a torque about the primary contact point KP between the first catch part 13a and toothed ring 8a. Owing to said torque, the first catch part 13a performs a tilting movement about said primary contact point KP, which tilting movement rotates the first catch part 13a in the direction of the guide path assigned to the first catch part 13a and presses said first catch part against said guide path.

The second catch part 13b is subjected to a force by the eccentric 11 in the same manner but in the other direction of rotation, and is thus pressed against the guide path assigned to the second catch part 13b. Owing to the rotations of the two catch parts 13a and 13b in different directions of rotation about the primary contact points KP that exist in each case with respect to the toothed ring 8a, the play in the catch composed of first catch part 13a and second catch part 13b is eliminated entirely. It is thereby possible, in both loading directions (in and counter to the direction of travel), for forces to be transmitted directly without a degree of free play initially having to be overcome.

Figure 6:
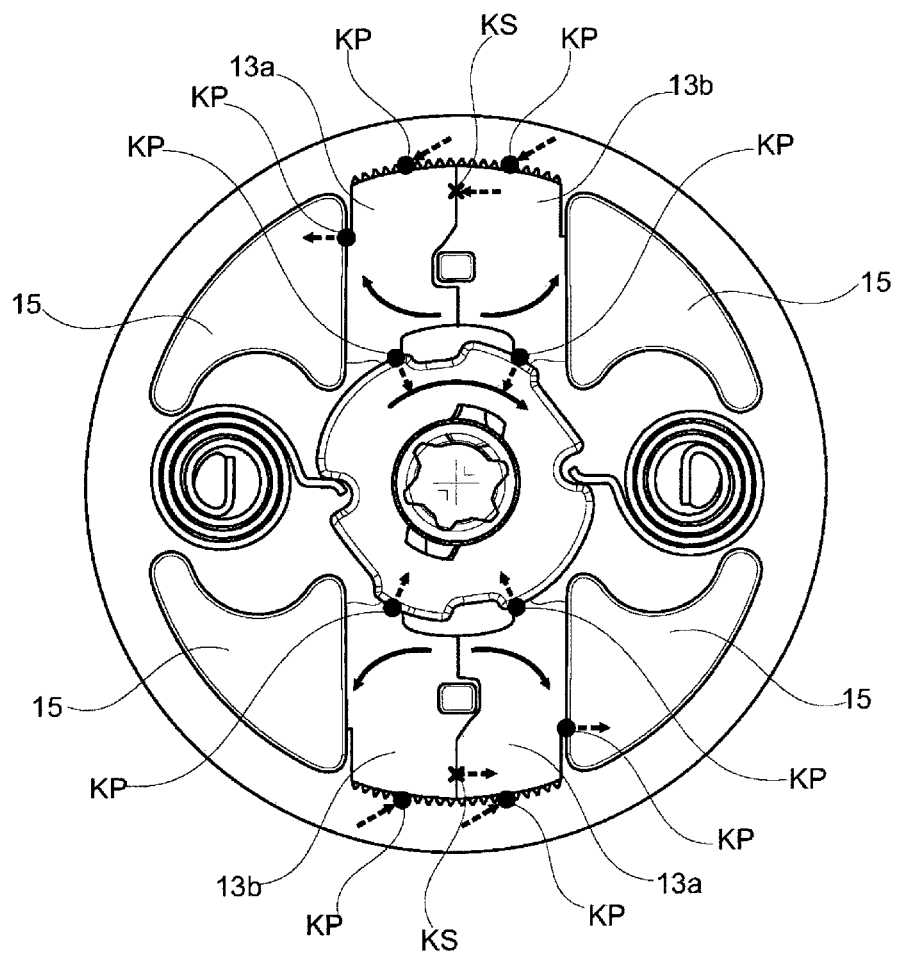
FIG. 6 is a sectional view corresponding to FIG. 4, with an illustration of the acting forces and contact points in the event of relatively high load, in particular in the event of a crash.

FIG. 6 illustrates the fitting 5 in the event of relatively high loads such as occur for example in the event of a crash. Owing to the high loads, a high torque is generated between the first fitting part 7 and the second fitting part 8 about the axis A. Owing to a toothing being configured outside the self-locking region, said high torque generates resultant forces, each with a force component, at the primary contact points KP between the toothed ring 8a and the toothings 13a', 13b', which force components load the catch parts 13a and 13b in the radial direction toward the axis A and thus have an opening action.

Owing to the force directions that are changed in relation to the normal load situation, a further force transmission point, the secondary contact point KS, is generated between the first catch part 13a and the second catch part 13b. Depending on the design of the catch parts 13a and 13b, said catch parts may already bear against one another, without load, in the region of the secondary contact point KS during normal operation. In the event of a crash, however, the secondary contact points KS are subjected to force.

FIG. 6 illustrates one load direction by way of example. High strengths can be obtained owing to the primary contact points KP between the eccentric 11 and the catch parts 13a, 13b and owing to the two primary contact points KP (bearing points) between the toothings 13a' and 13b' and the toothed ring 8a.

While specific embodiments of the invention have been shown and described in detail to illustrate the application of the principles of the invention, it will be understood that the invention may be embodied otherwise without departing from such principles.

The invention claimed is:

1. A fitting for a vehicle seat, the fitting comprising:
   a first fitting part;
   a second fitting part which is rotatable relative to the first fitting part about an axis, the second fitting part having a toothed ring with second fitting part toothing;
   a driveable eccentric which is mounted so as to be rotatable about the axis;
   at least one catch which is guided by the first fitting part so as to be movable in a radial direction with respect to the axis and which, for the locking of the fitting, can be moved radially outward under the action of the eccentric and interacts radially at the outside with the second fitting part, wherein the at least one catch comprises a first catch part and a second catch part, and each of the first catch part and the second catch part has a toothing for interacting with the second fitting part toothing, wherein the first catch part is connected to the second catch part with a form fit, and during the unlocking of the fitting, the first catch part is pulled radially inward by the second catch part owing to said form fit, wherein a clasp ring holds the first fitting part and the second fitting part together axially; and
   a control disk which is connected rotationally conjointly to the eccentric and which interacts with a lug of the at least one catch in order, during the unlocking process, to move the toothed ring and the at least one catch out of engagement.

2. The fitting as claimed in claim 1, wherein the at least one catch is split into the two catch parts along a parting line, and a direction of the parting line deviates from the radial direction in regions.

3. The fitting as claimed in claim 1, wherein the lug is integrally formed on the second catch part of the at least one catch, and the parting line is guided past the lug.

4. The fitting as claimed in claim 1, wherein the eccentric exerts a force on each of the two catch parts in different directions, such that the two catch parts are subjected to torques in mutually opposite directions of rotation about in each case a primary contact point between the first catch part and the toothed ring and a primary contact point between the second catch part and the toothed ring.

5. The fitting as claimed in claim 1, wherein a base circle radius of the toothings of the first catch part and a base circle radius of the toothings of the second catch part are smaller than a base circle radius of the toothed ring.

6. The fitting as claimed in claim 1, wherein the fitting has precisely two catches.

7. A vehicle seat comprising at least one fitting, the at least one fitting comprising:
   a first fitting part;
   a second fitting part which is rotatable relative to the first fitting part about an axis, the second fitting part having a toothed ring with second fitting part toothing;
   a driveable eccentric which is mounted so as to be rotatable about the axis;
   at least one catch which is guided by the first fitting part so as to be movable in a radial direction with respect to the axis and which, for the locking of the fitting, can be moved radially outward under the action of the eccentric and interacts radially at the outside with the second fitting part, wherein the at least one catch comprises a first catch part and a second catch part, and each of the first catch part and the second catch part has a toothing for interacting with the second fitting part toothing, wherein the at least one catch is split into the two catch parts along a parting line, and a direction of the parting line deviates from the radial direction in regions; and
   a control disk which is connected rotationally conjointly to the eccentric and which interacts with a lug of the at least one catch in order, during the unlocking process, to move the toothed ring and the at least one catch out of engagement.

8. The vehicle seat as claimed in claim 7, wherein the lug is integrally formed on the second catch part of the at least one catch, and the parting line is guided past the lug.

9. The vehicle seat as claimed in claim 8, wherein the first catch part is connected to the second catch part with a form fit, and during the unlocking of the fitting, the first catch part is pulled radially inward by the second catch part owing to said form fit.

10. The vehicle seat as claimed in claim 7, wherein the eccentric exerts a force on each of the two catch parts in different directions, such that the two catch parts are subjected to torques in mutually opposite directions of rotation about in each case a primary contact point between the first catch part and the toothed ring and a primary contact point between the second catch part and the toothed ring.

11. The vehicle seat as claimed in claim 7, wherein a base circle radius of the toothings of the first catch part and a base circle radius of the toothings of the second catch part are smaller than a base circle radius of the toothed ring.

12. The vehicle seat as claimed in claim 7, wherein a clasp ring holds the first fitting part and the second fitting part together axially.

13. The vehicle seat as claimed in claim 7, wherein the fitting has precisely two catches.

14. A fitting for a vehicle seat, the fitting comprising:
   a first fitting part;
   a second fitting part which is rotatable relative to the first fitting part about an axis, the second fitting part having a toothed ring with second fitting part toothing;
   a driveable eccentric which is mounted so as to be rotatable about the axis; and
   at least one catch which is guided by the first fitting part so as to be movable in a radial direction with respect to the axis and which, for the locking of the fitting, can be moved radially outward under the action of the eccentric and interacts radially at the outside with the second fitting part, wherein the at least one catch comprises a first catch part and a second catch part, and each of the first catch part and the second catch part has a toothing for interacting with the second fitting part toothing, wherein the first catch part is connected to the second catch part with a form fit, and during the unlocking of the fitting, the first catch part is pulled radially inward by the second catch part owing to said form fit, wherein a clasp ring holds the first fitting part and the second fitting part together axially, wherein the eccentric exerts a force on each of the two catch parts in different directions, such that the two catch parts are subjected to torques in mutually opposite directions of rotation about in each case a primary contact point between the first catch part and the toothed ring and a primary contact point between the second catch part and the toothed ring.

15. A fitting for a vehicle seat, the fitting comprising:
a first fitting part;
a second fitting part which is rotatable relative to the first fitting part about an axis, the second fitting part having a toothed ring with second fitting part toothing;
a driveable eccentric which is mounted so as to be rotatable about the axis; and
at least one catch which is guided by the first fitting part so as to be movable in a radial direction with respect to the axis and which, for the locking of the fitting, can be moved radially outward under the action of the eccentric and interacts radially at the outside with the second fitting part, wherein the at least one catch comprises a first catch part and a second catch part, and each of the first catch part and the second catch part has a toothing for interacting with the second fitting part toothing, wherein the first catch part is connected to the second catch part with a form fit, and during the unlocking of the fitting, the first catch part is pulled radially inward by the second catch part owing to said form fit, wherein a clasp ring holds the first fitting part and the second fitting part together axially, the fitting having precisely two catches.

* * * * *